(12) United States Patent
Stanley (10) Patent No.: US 6,556,053 B2
(45) Date of Patent: Apr. 29, 2003

(54) HALF-BRIDGE GATE DRIVER OPTIMIZED FOR HARD-SWITCHING

(75) Inventor: Gerald R Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

(21) Appl. No.: 10/068,271

(22) Filed: Feb. 6, 2002

(65) Prior Publication Data

US 2002/0125920 A1 Sep. 12, 2002

Related U.S. Application Data

(60) Provisional application No. 60/266,789, filed on Feb. 6, 2001.

(51) Int. Cl.[7] ............................. H03K 3/00; H03K 17/56
(52) U.S. Cl. ..................... 327/108; 327/382; 318/293; 318/599
(58) Field of Search .......................... 323/222; 318/293, 318/599; 327/108, 109, 382

(56) References Cited

U.S. PATENT DOCUMENTS

| | | | | |
|---|---|---|---|---|
| 4,972,130 A | * | 11/1990 | Rossi et al. ................. | 318/293 |
| RE35,806 E | * | 5/1998 | Rossi et al. ................. | 318/293 |
| 5,801,557 A | | 9/1998 | Dubhashi et al. | |
| 6,194,845 B1 | * | 2/2001 | Konopka et al. ....... | 315/209 R |
| 6,211,623 B1 | * | 4/2001 | Wilhelm et al. ............ | 315/224 |
| 6,211,706 B1 | | 4/2001 | Choi et al. | |
| 6,222,751 B1 | * | 4/2001 | Portaluri et al. ............ | 318/439 |

* cited by examiner

*Primary Examiner*—Bao Q. Vu
(74) *Attorney, Agent, or Firm*—Brinks Hofer Gilson & Lione (57) ABSTRACT

A half-bridge gate driver circuit including two separate floating high-side driver circuits for operating a switch circuit having a high-side switch and a low-side switch. Each of the driver circuits include input control logic which is referenced to a supply signal with a potential that becomes negative relative to the negative common terminal of the switches, thereby enhancing the operation of the switch circuit. The circuit may further include signal translation stages for translating control signals to the control logic of the driver circuits. The signal translation stages include a plurality of cascoded parasitic transistors which provide a neutralizing capacitance to minimize noise.

28 Claims, 5 Drawing Sheets

(Prior Art)

HALF-BRIDGE GATE DRIVER OPTIMIZED FOR HARD-SWITCHING

BACKGROUND OF THE INVENTION

1. Field of the Invention

The present invention relates to switch-mode, half-bridge power circuits using gated devices, and, more particularly, to opposed current, power converter circuits driven by integrated circuit gate drivers with internal floating gate driver sections.

2. Description of the Related Art

Modern half-bridge power circuits are frequently driven by integrated circuit (IC) gate drivers with internal floating gate driver sections driving the more positive voltage high-side of the half-bridge. The high-side and low-side input control signals are supplied common to the most negative portion of the IC. When IC gate drivers are used in high-voltage, hard-switching, half-bridge power converters, a problem can arise at the turn-off of the positive voltage high-side switch of the half-bridge. In this situation, the instantaneous voltage on the source lead of the high-side switch can momentarily go negative relative to the negative substrate of the IC. The principal reason for the voltage spike is that in a hard-switching converter, the free-wheeling diode cannot become fully conductive instantaneously. The free-wheeling diode's forward voltage can thus become rather large during this time delay compared to what would be expected in the DC case. In the transient case, the diode appears as a very high resistance device and may have 20 volts forward-biased across it. The 20 volt forward bias may last for approximately 10 to 20 nanoseconds until the diode becomes fully injected. The result is that the gate drive voltage goes negative with respect to the negative substrate of the IC with 20 volts plus any additional voltage due to inductance. As a result, the IC may cause a malfunction of the driver logic resulting in failure of the power stage by simultaneous conduction of the power switches or direct destruction of the gate driver IC. At a minimum, noise will be introduced into the system.

Methods have been developed to attempt to correct this problem. One method attempts to reduce the added voltage generated by the intrinsic inductance in the circuit, thereby decreasing the negative voltage spike imposed on the IC at the turn-off of the positive switch. This method has a serious drawback in the field of the present invention. Even if a designer were to compensate for all inductances in the construction of the circuit, the transient forward voltage across the free-wheeling diode would still be present in the circuit. Attempting to compensate for the intrinsic inductance in the circuit fails to provide a successful solution in fast-switching, high-frequency applications since the forward voltage produced by the free-wheeling diode will still cause simultaneous conduction of the power switches or direct destruction of the gate driver IC.

Another problem of conventional designs is that they have a slower high-side gate driver due to the increased number of cascaded stages in the high-side gate driver as compared to the low-side gate driver. Some designs attempt to match the propagation delay between the high-side and low-side outputs by adding delays in the low side path. A typical method of adding such delays is to cascade an even number of inverters. Despite this effort, the result of the increased number of cascaded stages is imprecise timing in the circuit resulting in common-mode currents or shoot-through. The imprecise timing becomes particularly problematic when attempting to maintain timing over both time and temperature variations. Tolerances of the power switches, gate drive resistors, temperature thresholds, imperfections of the IC, and other parameters must be accounted for. When the tolerances are loose, increased distortion occurs in certain applications, for example, pulse-width modulated (PWM) audio amplifiers.

SUMMARY OF THE INVENTION

The present invention provides a circuit for minimizing the effects on gate driver ICs of high-voltage, hard-switching such as when driving opposed current power converters and other similar applications. The present invention overcomes the shortcomings of the prior art by utilizing two separate high-side gate drivers to drive an opposed current power converter, as opposed to the conventional, single high-side gate driver together with a low-side gate driver.

The invention, in one form thereof, comprises a switch-mode opposed current power converter with two separate floating high-side gate drivers. The removal of the low-side driver from the circuit permits the negative substrate potential of the IC to be as negative as necessary to protect the IC. The result is maximum isolation between the control signals for desired applications. The isolation between the control signals reduces the harmful effect of noise generated by the transition of one switch on the modulation process of another switch. The isolation benefits gained by the present invention allow for a single IC to incorporate multiple high-side gate drivers. The present invention has various applications including, for example, audio amplifiers and three-phase motors which require an IC with six high-side gate driver stages.

The high-side design construction operates both the high-side and low-side switches with input control logic referenced to a supply with a negative substrate potential which, in operation, becomes negative with respect to the negative common terminal of both power switches. In effect, the negative substrate potential will be as negative as the most negative spike of forward voltage produced by the free-wheeling diode at the turn-off of the positive switch, thereby preventing a malfunction of the driver logic and destruction of the gate driver IC.

The input control logic reference supply voltage can be produced from a variety of sources. A battery could provide the necessary voltage, although this adds complexity and cost to the system. In one exemplary embodiment, the reference supply voltage is acquired by manipulating the forward recovery voltage of the free-wheeling diode to obtain the necessary voltage required to protect the IC. In another embodiment, the input control logic supply voltage is acquired by the use of an AC power supply already present in the circuit. The above-described embodiments provide the necessary voltage to the input control logic without increasing cost or introducing the added complexity associated with an extra power supply.

In one embodiment of the present invention, a signal translation stage may be included to provide a front-end scheme of translating the input signals to the control logic of the gate drivers. The signal translation stage can be used to correct for noise issues associated with the input signals to the control logic of the gate drivers. The compensation of the signal translation stage is equally useful in correcting noise issues whether they originated on the negative supply voltage ($-V_{cc}$) or were a product of the derived reference supply voltage ($-V_{cx}$) as further derived below. A signal translation stage includes three or more cascaded transistors with the associated bypass capacitors and resistors to more easily dissipate the noise incident on the control logic from the input signals. Also included in the signal translation stage are parasitic transistors which form the appropriate nonlinear capacitance to track voltages in the cascaded chain, and to properly cancel the effects of noises on the $-V_{cx}$ supply. The transistors utilized in the construction of the signal translation stage include, but are not limited to, those shown in the drawings. One skilled in the art could readily adapt other types of transistors to the present application. An exemplary embodiment of the signal translation stage is a unique type of high-side gate driver IC which translates the signal from ground to the negative potential of the $-V_{cx}$ supply.

An advantage of the present invention is that it permits a negative voltage spike on the source lead of the high-side power switch without risking the dysfunction of the converter or other damage to the IC.

Another advantage of the present invention is that the symmetric design allows the propagation delays of the IC to be more uniform for both the high-side and low-side power switches.

Still another advantage of the present invention is the minimization of the quiescent output ripple for an interleaved converter.

A still further advantage of the present invention is a more complete isolation of the input from the output of the driver, thereby reducing noise incident on the input.

Yet another advantage of the present invention is the maximization of the drain source voltage on the internal gate driver translating field effect transistors, thereby reducing the propagation delay of the high-side driver.

BRIEF DESCRIPTION OF THE DRAWINGS

The above-mentioned and other features and advantages of this invention, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
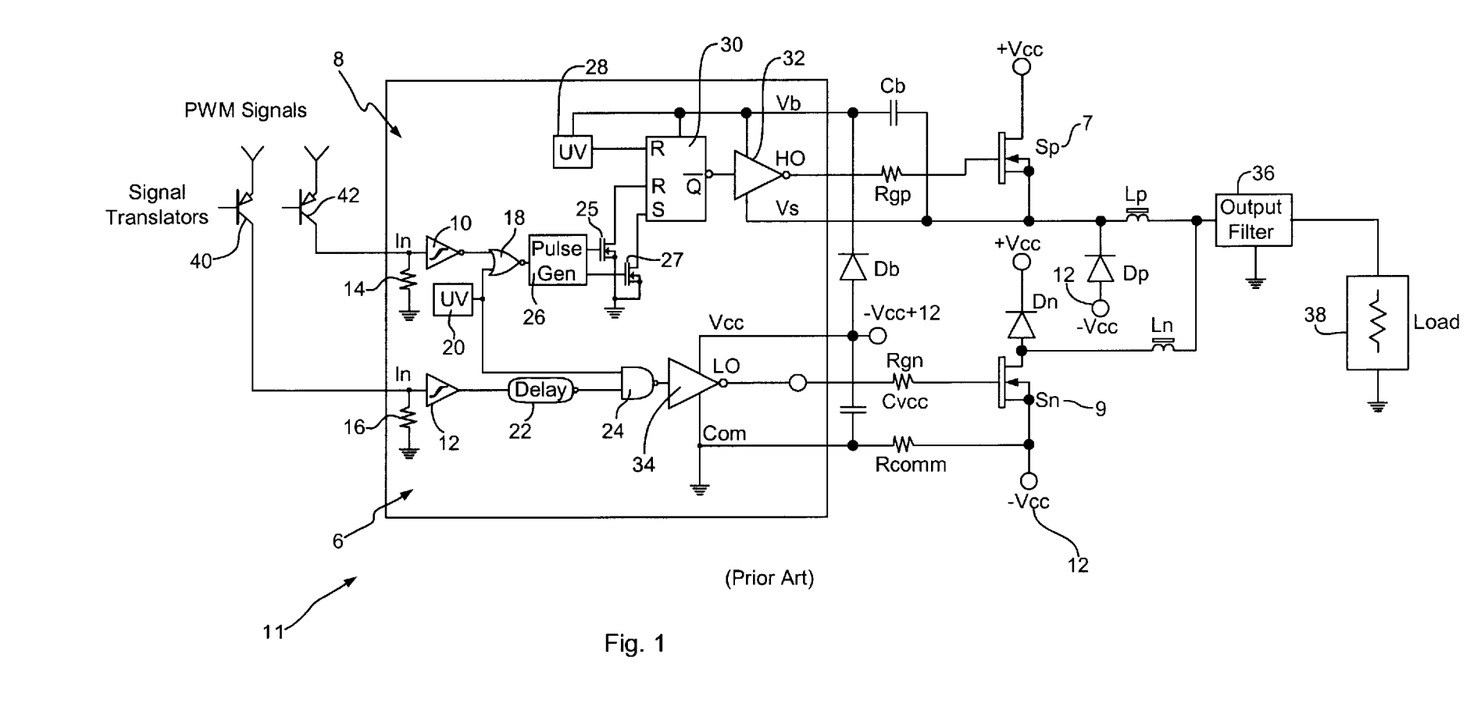
FIG. 1 is a schematic diagram of a prior art circuit including a high-side gate driver and a low-side gate driver.

Referring now to the drawings, FIG. 1 illustrates a prior art opposed current power converter 11. The PWM signals are input into the low-side driver circuit 6 after passing through low-side input signal translator transistor 40 and into the high-side circuit 8 driver after passing through high-side input signal translator transistor 42. The input signals communicate with high-side switch 7 and low-side switch 9 to produce on and off conditions. The input signal for high-side switch 7 is received by Schmitt trigger 10 which provides robustness to the logic to make it less sensitive to noisy input signals. NOR gate 18 receives output signals from Schmitt trigger 10 and undervoltage device 20. Undervoltage device 20 functions as an interlock by defeating the drive signal if too little voltage is present. Pulse generator 26 turns on or off in response to a high or low output from NOR gate 18. Pulse generator 26 provides an alternating pulse signal first to translating field effect transistor 27 and then to translating field effect transistor 25. The outputs from translating field effect transistors 25, 27 are sent to receiving stage 30 to set and then reset the corresponding input pins on the flip-flop of receiving stage 30. Undervoltage device 28 is connected to the reset pin on receiving stage 30, and functions as an interlock by defeating the drive signal if too little voltage is present. The output from receiving stage 30 is routed to high-side gate driver 32. High-side gate driver 32 is powered by voltage $V_b$ and voltage $V_s$. The driving and inverted output from high-side gate driver 32 typically produces one-half (½) to about three (3) amperes of drive. The drive output is fed through resistor $R_{gp}$ to drive high-side switch 7.

The input signal for low-side switch 9 is similarly received by Schmitt trigger 12 connected to time delay block 22. Gate 24 receives output signals from time delay block 22 and undervoltage device 20. Low-side gate driver 34 receives the output from gate 24. Low-side gate driver 34 is powered by voltage $V_{cc}$ 15 and is connected to the common signal of the IC. The driving and inverted output from low-side gate driver 34 drives low-side switch 9 through resistor $R_{gn}$.

Figure 2:
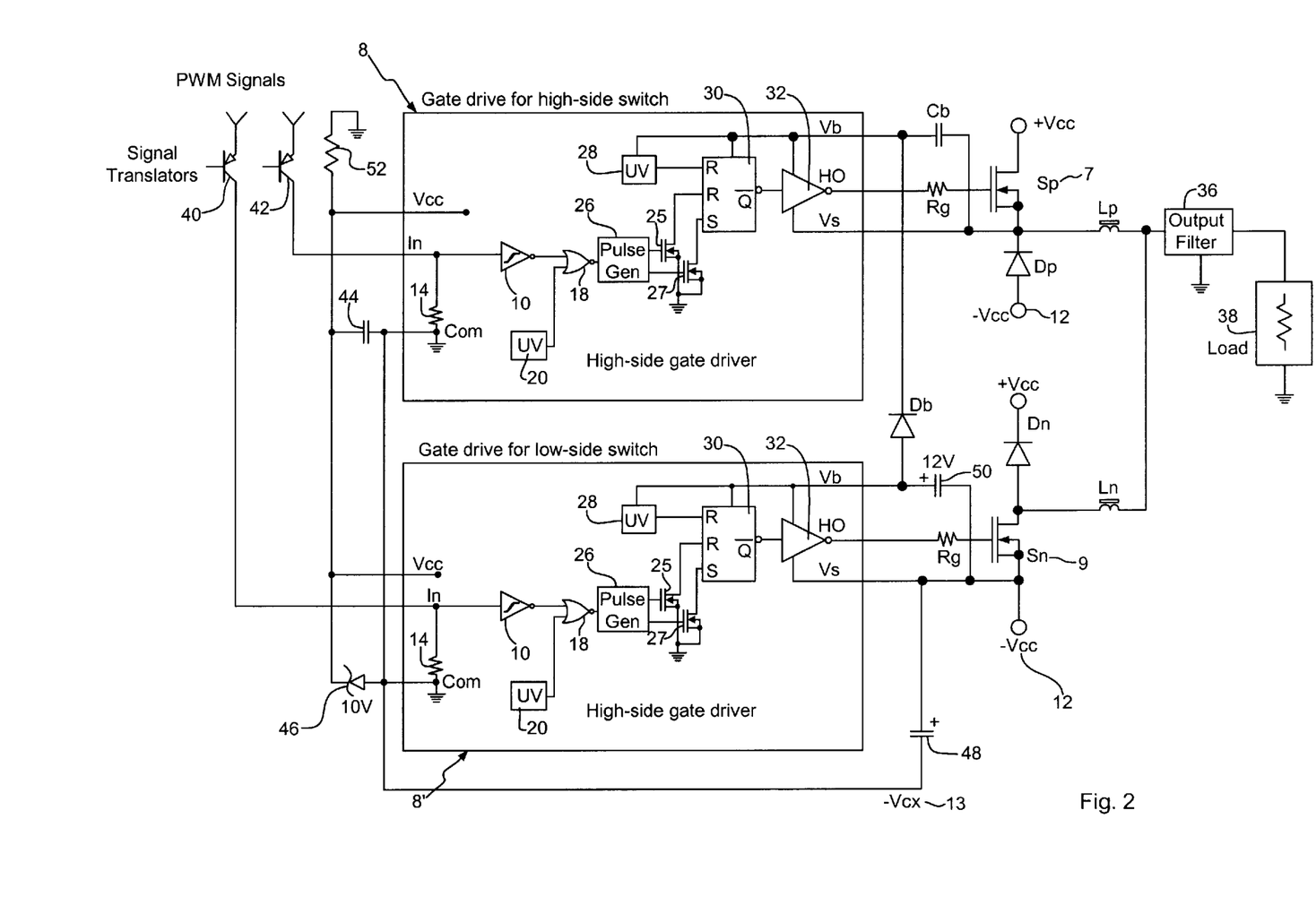
FIG. 2 is a schematic diagram of two separate high-side gate drivers and an independent negative substrate potential which supplies the input control logic of the ICs.

FIG. 2 is a schematic diagram of an opposed current power converter driven by two separate high-side driver circuits 8, 8' in accordance with the present invention. The input signal for high-side switch 7 is received by Schmitt trigger 10. NOR gate 18 receives output signals from Schmitt trigger 10 and undervoltage device 20. Undervoltage device 20 functions as an interlock as described above. Pulse generator 26 receives a high or low output from NOR gate 18 indicating when to turn on or turn off. Pulse generator 26 provides an alternating pulse signal first to translating field effect transistor 27 and then to translating field effect transistor 25. The outputs of transistors 25, 27 are sent to receiving stage 30 to set and then reset the corresponding input pins of the flip-flop of receiving stage 30. Undervoltage device 28 is connected to the reset pin on receiving stage 30, and functions as an interlock as described above. The output from receiving stage 30 is routed to high-side gate driver 32, which is powered by voltage $V_b$ and voltage $V_s$. The driving and inverted output from high-side gate driver 32 typically produces one-half (½) to about three (3) amperes of drive. The drive output of driver 32 is fed through resistor $R_g$ to drive high-side switch 7.

The input signal to high-side driver circuit 8' for low-side switch 9 is translated through the identical logic as the input signal for high-side switch 7. The drive output for low-side switch 9, however, is fed through resistor $R_g$ to drive low-side switch 9.

Battery 48 produces voltage $-V_{cx}$ 13 which supplies the input control logic reference voltage. The logic of the two high-side driver circuits 8, 8' is powered by a simple shunt regulator with Zener diode 46, bypass capacitor 44, and resistor 52 connected to earth ground. It should be understood that the value of the voltage $-V_{cx}$ 13 produced by battery 48 needs to be as negative as the greatest excursion, i.e., most negative value, of the forward voltage across diode $D_p$ 14. Also, it should be known that the common portion is a recitation of the voltage through the diode 14.

Figure 3:
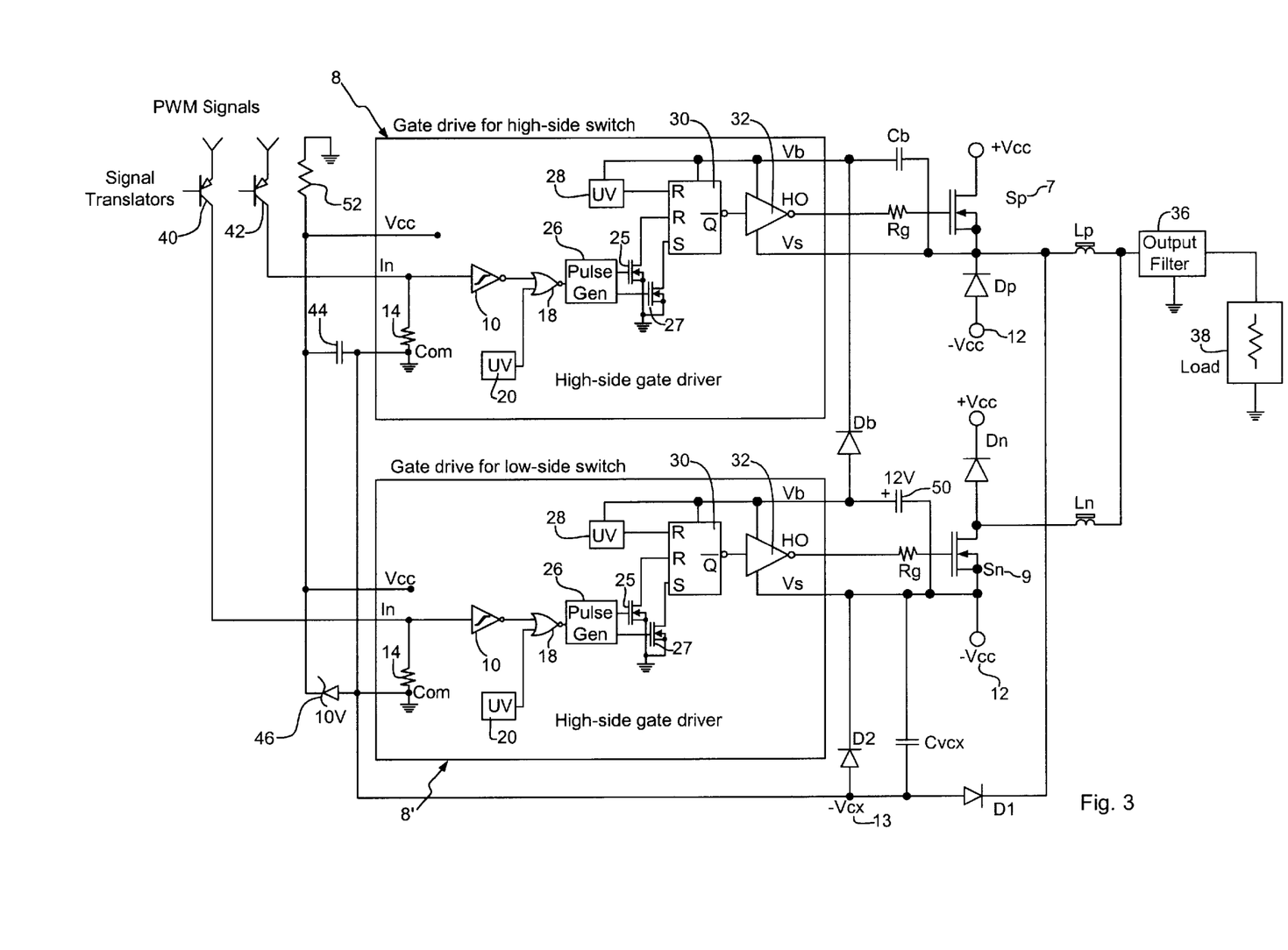
FIG. 3 is a schematic diagram of two separate high-side gate drivers and a circuit for deriving the independent negative substrate potential $(-V_{cx})$ which supplies the input control logic of the ICs.

FIG. 3 illustrates the use of two separate high-side driver circuits 8, 8' similar to that of FIG. 2 and represents another embodiment of a circuit for producing $-V_{cx}$ 13. Diode $D_p$ 14 is connected to diode $D_1$. When a large forward voltage appears across diode $D_p$ 14 at the turn-off of high-side switch 7, diode $D_1$ begins to conduct because the voltage on the negative side of diode $D_1$, i.e., the side connected to diode $D_p$ 14, is more negative than $-V_{cc}$ 15. Once diode $D_1$ begins to conduct, $-V_{cx}$ 13 is pulled down the value of $V_s$ during the transient excursion of switch 7. During this excursion, $-V_{cx}$ 13 has a value which is $V_s$ plus the turn-on voltage of diode $D_1$. The result is that the voltage levels of $-V_{cx}$ 13 and $V_s$ are very close to each other, and both voltages are more negative than $-V_{cc}$ 15. Diode $D_2$ provides $-V_{cx}$ 13 during quiescent conditions when the converter is not switching, thereby preventing problems to the IC when not in operation.

Figure 4:
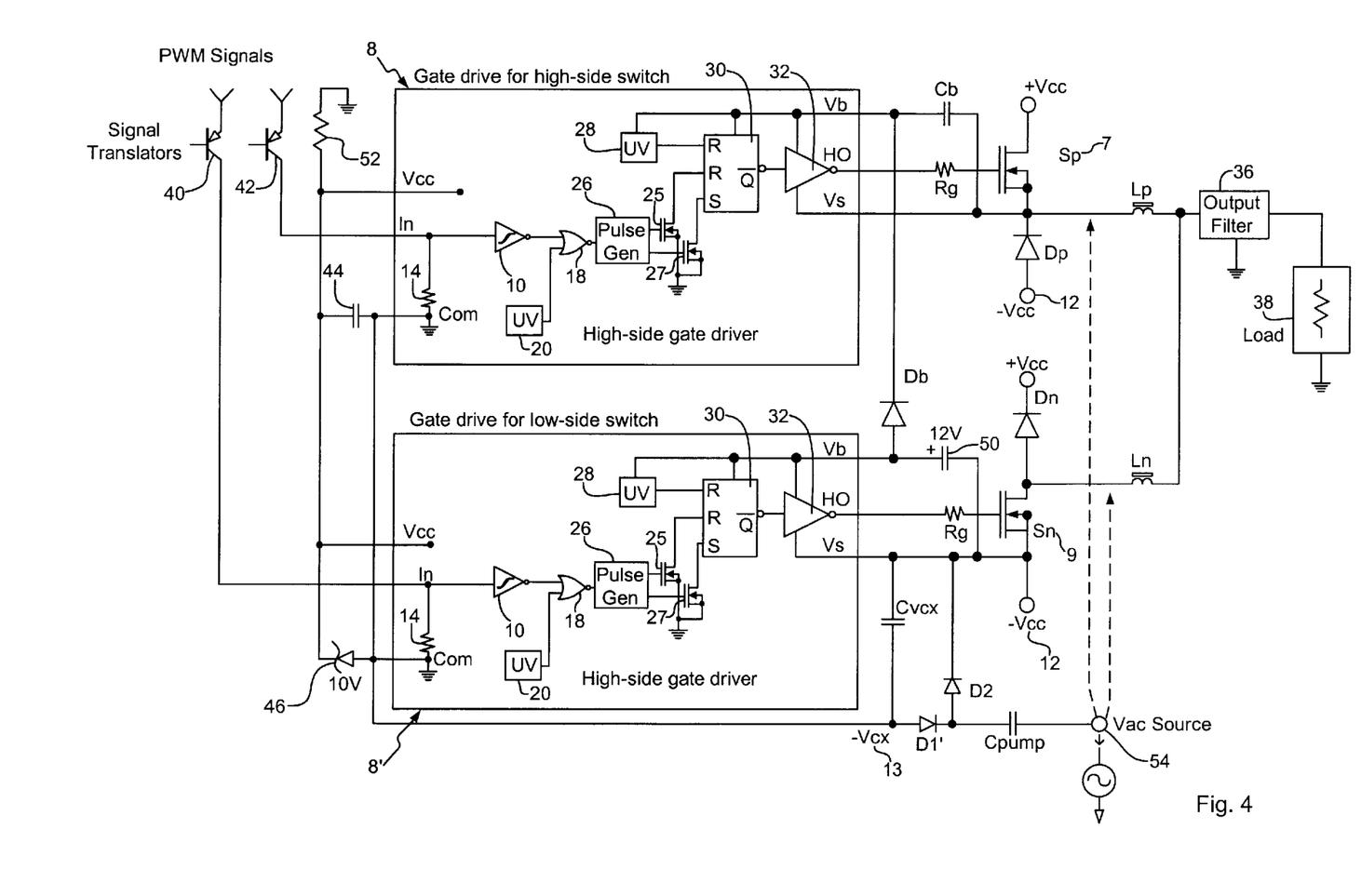
FIG. 4 is a schematic diagram of two separate high-side gate drivers and another embodiment of a circuit for deriving $-V_{cx}$.

FIG. 4 illustrates the use of two separate high-side driver circuits 8, 8' as in FIG. 2 with an arbitrary AC voltage source 54 to produce $-V_{cx}$ 13. Source 54 is connected to capacitor $C_{pump}$, which in turn is connected to both diode $D_1'$ and diode $D_2$. Source 54 could be generated by a separate AC generator or one of several small AC power supplies present in a typical application circuit such as a switched-mode power converter for audio applications. The dotted lines in FIG. 4 show two possible points of connection for source 54. Source 54 should operate at the same frequency at which the entire circuit is operating, or some harmonic thereof, to avoid undesirable beat frequencies.

In operation, a current is produced through diode $D_2$ during the positive voltage swing of source 54. Correspondingly, on the negative voltage swing of source 54, diode $D_1'$ begins to conduct, thereby pulling $-V_{cx}$ 13 down to $V_s$ during the instantaneous excursion of the high-side switch.

Figure 5:
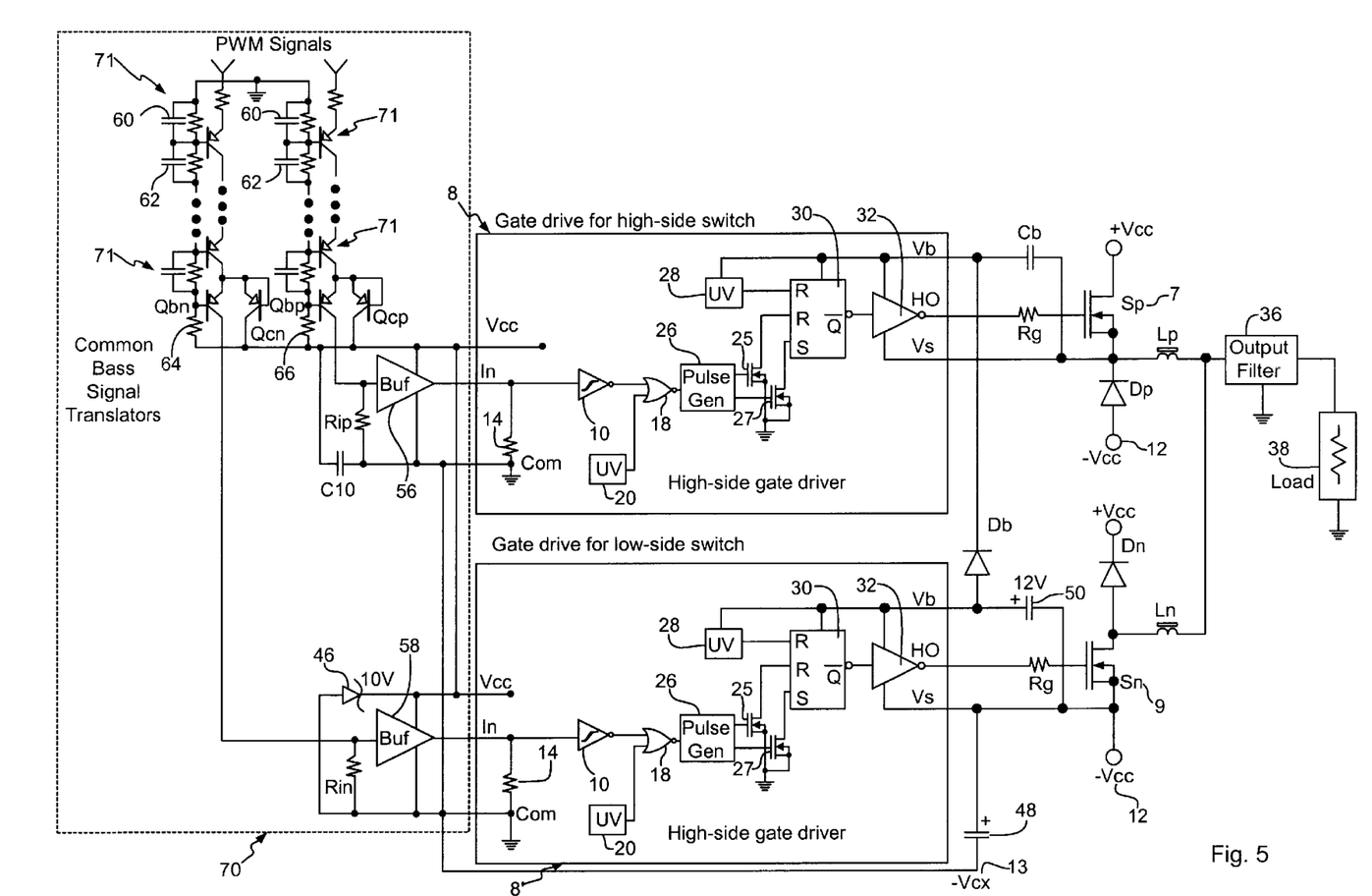
FIG. 5 is a schematic diagram of two separate high-side gate drivers, a circuit for deriving $-V_{cx}$, and a signal translation stage.

FIG. 5 includes a signal translation stage 70 for processing the input signals to the gate drivers. Signal translation stage 70 could also have been used with the circuits of FIGS. 1 through 4. Signal translation stage 70 comprises several, typically three or more, common base stages 71 cascoded together (i.e., the collector of one transistor of a stage 71 is connected to the emitter of the transistor of the next stage 71). Each PWM switch enable signal travels through the emitter of each of its respective common base stages 71 and out the collector. In a practical embodiment, each stage 71 is a divider which is designed to translate the PWM signals down from earth ground before they are input into high-side driver circuits 8, 8'. Several small stages 71 are used to translate the large voltage on the input signals, since small transistors can only translate a portion of the large voltage. On the other hand, small transistors are beneficial because they have low output capacitance.

Each stage 71 includes capacitors 60, 62 for noise reduction. For each additional stage not shown, more capacitors would be present to perform the same function. The base node of each transistor of the chain of stages 71 is bypassed to earth ground, except for translating transistors $Q_{bn}$ and $Q_{bp}$ which are tied to $V_{cc}$ 15 through resistors 64, 66, respectively. The AC noise incident from the PWM signals exists across the base-collector junctions of translating transistors $Q_{bn}$ and $Q_{bp}$. Translating transistors $Q_{bn}$ and $Q_{bp}$ carry the current from the PWM signals, and are selected for minimum output capacitance. This permits a minimum disturbance to the collector current when noise is imposed between $-V_{cx}$ 13 and earth ground. Parasitic transistors $Q_{cn}$ and $Q_{cp}$ are used to cancel the noise present in the collectors of translating transistors $Q_{bn}$ and $Q_{bp}$.

In operation, signal translation stage 70 of FIG. 5 produces a current that augments the current flow down through the chain such that a minimum voltage is induced across resistors $R_{ip}$ and $R_{in}$ due to a change in current. An inversion occurs in the voltage across resistors $R_{ip}$ and $R_{in}$ because they are in series with the signal path. In other words, if $-V_{cx}$ 13 instantaneously goes more negative, the voltages across resistors $R_{ip}$ and $R_{in}$ go positive with respect to the input pins of buffers 56, 58, respectively. The voltages across resistors $R_{ip}$ and $R_{in}$ are literally out of phase with $-V_{cx}$ 13. The net noise current seen by $R_{ip}$ and $R_{in}$ pollutes the signals which are incident on buffers 56 and 58. Buffers 56 and 58 are referenced to $-V_{cx}$ 13. This embodiment permits buffers 56 and 58 to cancel out the noise present at their inputs.

The noise voltage across translating transistors $Q_{bn}$ and $Q_{bp}$ is the same voltage that is desired to exist across the transistors $Q_{cn}$ and $Q_{cp}$. Charging currents are fed back to the chain to cancel the noise in the base-collector capacitance of translating transistors $Q_{bn}$ and $Q_{bp}$. Translating transistors $Q_{bn}$ and $Q_{bp}$, however, do not have the same operating point as parasitic transistors $Q_{cn}$ and $Q_{cp}$ because parasitic transistors $Q_{cn}$ and $Q_{cp}$ have no current flow through them. The output capacitance of a transistor is slightly increased when current is flowing through it. Since current is flowing through translating transistors $Q_{bn}$ and $Q_{bp}$, but not through parasitic transistors $Q_{cn}$ and $Q_{cp}$, the output capacitances of the transistors are different. This is compensated by connecting the collectors of parasitic transistors $Q_{cn}$ and $Q_{cp}$ to $-V_{cc}$ 15 because that forces the output capacitance of parasitic transistors $Q_{cn}$ and $Q_{cp}$ to increase and compensates for their lack of carrying bias. With this compensation, parasitic transistors $Q_{cn}$ and $Q_{cp}$ form the appropriate nonlinear capacitance to track voltage in the array, and to properly cancel the effects of noise from the $-V_{cx}$ 13 supply line.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A gate driver circuit for a half-bridge derived switching power converter having a high-side switch coupled to a negative potential and a low-side switch coupled to the negative potential, the gate driver circuit comprising:
   a first high-side driver circuit referenced to a common potential, the first high-side driver circuit capable of driving the high-side switch to produce a first output; and
   a second high-side driver circuit referenced to the common potential, the second high-side driver circuit capable of driving a low-side switch to produce a second output,
   where the common potential remains more negative than the first output.

2. The gate driver circuit of claim 1, where the common potential is selectively provided with one of the negative potential and the first output as a function of the voltage magnitude of the first output.

3. The gate driver circuit of claim 1, where the common potential is selectively provided with one of the negative potential and a charge pump driven by an AC source.

4. The gate driver circuit of claim 1, where signal propagation delay through the first and second high-side driver circuits is substantially the same.

5. The gate driver circuit of claim 1, where control signals provided to the first and second high-side driver circuits are isolated from each other to minimize noise derived from switching.

6. The gate driver circuit of claim 1, further comprising a signal translation stage coupled with at least one of the first and second high-side driver circuits, where the signal translation stage includes a plurality of cascaded common base stages and a buffer, the signal translation stage operable to translate the reference of an input signal to the common potential.

7. The gate driver circuit claim 6, where the signal translation stage includes a parasitic transistor coupled with one of the common base stages, the parasitic transistor operable to inject noise compensation into the translated input signal.

8. The gate driver circuit of claim 6, where the signal translation stage is operable as a voltage divider to translate PWM signals.

9. The gate claim 6, where driver each of the common base stages includes a transistor and a capacitor, where the capacitor is operable to provide noise reduction.

10. The gate driver circuit of claim 6, where all but one of the common base stages include a transistor having a base node that is bypassed to ground potential, the remaining common base stage includes a transistor that is coupled with the common potential through a resistor.

11. The gate driver circuit of claim 6, where at least one of the first and second high-side driver circuits are capable of driving the respective high-side and low-side switches as a function of the translated input signal provided by the signal translation stage.

12. A gate driver circuit for a half-bridge derived switching power converter having a first switch coupled to a negative potential and a positive potential that define a potential range therebetween, and a second switch also coupled to the positive and negative potentials, the gate driver circuit comprising:

a first high-side driver circuit capable of operating the first switch; and a second high-side driver circuit capable of operating the second switch;

where the first and second high-side driver circuits are supplied with a power input that is referenced to a common potential, the common potential is dynamically adjustable to be outside the potential range when an output of the first switch becomes more negative than the negative potential.

13. The gate driver circuit of claim 12, where the common potential is substantially the same as the negative potential when the output of the first switch is more positive than the negative potential.

14. The gate driver circuit of claim 12, where the common potential is pulled down to be substantially the same as the output of the first switch when the output of the first switch is more negative than the negative potential.

15. The gate driver circuit of claim 12, where the common potential is dynamically adjustable as a function of a transient excursion of the first switch during turn off.

16. The gate driver circuit of claim 12, further comprising a first and second translation stage coupled with the first and second high-side driver circuits, respectively, where each of the first and second translation stages includes a plurality of cascaded transistors and a parasitic transistor coupled with one of the cascaded transistors.

17. The gate driver circuit of claim 12, where the parasitic transistor is operable to provide charging currents to cancel the noise formed in the translation stage by at least one of the common potential and the negative potential.

18. The gate driver circuit of claim 12, where input signals are propagated through substantially identical logic in the first high-side driver circuit and the second high-side driver circuit.

19. The gate driver circuit of claim 12, where both the first and the second high-side driver circuits include a pulse generator and a receiving stage.

20. A half-bridge derived switching power converter comprising:

a high-side switch having an output, where the output of the high-side switch is coupled with a negative supply voltage;

a low-side switch having an output, where the output of the low-side switch is coupled with a positive supply voltage, and also inductively coupled with the output of the high-side switch;

a first high-side driver circuit operable to drive the high-side switch as a function of an input signal;

a second high-side driver circuit operable to drive the low-side switch as a function of an input signal; and a reference supply voltage supplied to the first and second high-side driver circuits, where the reference supply voltage remains more negative than the output of the high-side switch.

21. The half-bridge derived switching power converter of claim 20, further comprising a signal translation stage coupled between the input signal and an input of at least one of the first and second high-side driver circuits, the signal translation stage operable to translate the input signal to the potential of the reference supply voltage.

22. The half-bridge derived switching power converter of claim 21, where the translation stage includes three or more cascaded transistors each with a base node bypassed to earth ground through a capacitor.

23. The half-bridge derived switching power converter of claim 21, where the translation stage includes a parasitic transistor operable to cancel the effects of noise induced by at least one of the reference supply voltage and the negative supply voltage.

24. The half-bridge derived switching power converter of claim 20, where the first and second high-side driver circuits are operable with separate and isolated input signals.

25. The half-bridge derived switching power converter of claim 20, where the high-side and low-side switches are part of an opposed current power converter.

26. The half-bridge derived switching power converter of claim 20, where the high-side switch includes a diode coupled between the first output and the negative supply voltage, the reference supply voltage being selectively representative of rectification of the forward voltage across the diode when the high-side switch is first opened.

27. The half-bridge derived switching power converter of claim 20, further comprising a first diode coupled between the negative supply voltage and a second diode, the second diode coupled between the first diode and an output of the high-side switch, where the reference supply voltage is selectively provided with one of the negative supply voltage and the voltage at the output of the high-side switch as a function of the first and second diodes.

28. The half-bridge derived switching power converter of claim 20, further comprising an AC supply, where the reference supply voltage is selectively provided with one of the AC supply and the negative supply voltage.

* * * * *

UNITED STATES PATENT AND TRADEMARK OFFICE
CERTIFICATE OF CORRECTION

PATENT NO. : 6,556,053 B2
DATED : April 29, 2003
INVENTOR(S) : Stanley

It is certified that error appears in the above-identified patent and that said Letters Patent is hereby corrected as shown below:

<u>Column 7,</u>
Line 28, after "gate" and before "claim," insert -- driver circuit of --.
Line 28, after "where" and before "each," delete "driver."

Signed and Sealed this

Nineteenth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.       : 6,556,053 B2
APPLICATION NO.  : 10/068271
DATED            : April 29, 2003
INVENTOR(S)      : Stanley It is certified that error appears in the above-identified patent and that said Letters Patent is hereby corrected as shown below:

In the Title page of the patent, replace (Prior Art) Fig.1, with Fig 2.
The title page, showing an illustrative figure, should be deleted and substitute therefore the attached title page.

Signed and Sealed this

Twenty-first Day of November, 2006

JON W. DUDAS
*Director of the United States Patent and Trademark Office*

(12) United States Patent
Stanley (10) Patent No.: US 6,556,053 B2
(45) Date of Patent: Apr. 29, 2003

(54) HALF-BRIDGE GATE DRIVER OPTIMIZED FOR HARD-SWITCHING

(75) Inventor: Gerald R Stanley, Osceola, IN (US)

(73) Assignee: Harman International Industries, Incorporated, Northridge, CA (US)

(*) Notice: Subject to any disclaimer, the term of this patent is extended or adjusted under 35 U.S.C. 154(b) by 0 days.

(21) Appl. No.: 10/068,271

(22) Filed: Feb. 6, 2002

(65) Prior Publication Data

US 2002/0125920 A1 Sep. 12, 2002

Related U.S. Application Data

(60) Provisional application No. 60/266,789, filed on Feb. 6, 2001.

(51) Int. Cl.⁷ .................. H03K 3/00; H03K 17/56
(52) U.S. Cl. .............. 327/108; 327/382; 318/293; 318/599
(58) Field of Search ............... 323/222; 318/293, 318/599; 327/108, 109, 382

(56) References Cited

U.S. PATENT DOCUMENTS

| | | | |
|---|---|---|---|
| 4,972,130 A | * | 11/1990 | Rossi et al. ............ 318/293 |
| RE35,806 E | * | 5/1998 | Rossi et al. ............ 318/293 |
| 5,801,557 A | | 9/1998 | Dubhashi et al. |
| 6,194,845 B1 | * | 2/2001 | Konopka et al. ........ 315/209 R |
| 6,211,623 B1 | * | 4/2001 | Wilhelm et al. ........ 315/224 |
| 6,211,706 B1 | | 4/2001 | Choi et al. |
| 6,222,751 B1 | * | 4/2001 | Portaluri et al. ........ 318/439 |

* cited by examiner

Primary Examiner—Bao Q. Vu
(74) Attorney, Agent, or Firm—Brinks Hofer Gilson & Lione (57) ABSTRACT

A half-bridge gate driver circuit including two separate floating high-side driver circuits for operating a switch circuit having a high-side switch and a low-side switch. Each of the driver circuits include input control logic which is referenced to a supply signal with a potential that becomes negative relative to the negative common terminal of the switches, thereby enhancing the operation of the switch circuit. The circuit may further include signal translation stages for translating control signals to the control logic of the driver circuits. The signal translation stages include a plurality of cascoded parasitic transistors which provide a neutralizing capacitance to minimize noise.

28 Claims, 5 Drawing Sheets

Fig. 2